United States Patent [19]

Park

[11] Patent Number: 5,585,284

[45] Date of Patent: Dec. 17, 1996

[54] METHOD OF MANUFACTURING A SOI DRAM

[75] Inventor: Sung W. Park, Kyungki-Do, Rep. of Korea

[73] Assignee: Hyundai Electronics Industries Co., Ltd., Kyungki-do, Rep. of Korea

[21] Appl. No.: 265,269

[22] Filed: Jul. 1, 1994

[30]   Foreign Application Priority Data

Jul. 2, 1993 [KR] Rep. of Korea ............... 93-12365
Jul. 2, 1993 [KR] Rep. of Korea ............... 93-12366

[51] Int. Cl.⁶ ................. H01L 21/8242; H01L 21/84
[52] U.S. Cl. ................. 437/21; 437/52; 437/60; 437/919
[58] Field of Search ................. 437/21, 52, 60, 437/919, 915

[56]  References Cited

U.S. PATENT DOCUMENTS

| 4,609,407 | 9/1986 | Masao et al. . | |
| 5,102,819 | 4/1992 | Matsushita et al. | 437/52 |
| 5,122,476 | 6/1992 | Fazan et al. | 437/52 |
| 5,173,753 | 12/1992 | Wu et al. . | |
| 5,179,033 | 1/1993 | Adan | 437/41 |
| 5,219,779 | 6/1993 | Suzuki | 437/47 |
| 5,268,321 | 12/1993 | Shimizu et al. | 437/52 |
| 5,296,402 | 3/1994 | Ryou | 437/60 |
| 5,302,542 | 4/1994 | Kishi et al. | 437/52 |
| 5,371,032 | 12/1994 | Nishihara | 437/52 |
| 5,406,102 | 4/1995 | Oashi | 257/296 |
| 5,420,048 | 5/1995 | Kondo | 437/21 |
| 5,424,235 | 6/1995 | Nishihara | 437/52 |

FOREIGN PATENT DOCUMENTS 5-175453  7/1993  Japan .

Primary Examiner—Mary Wilczewski
Assistant Examiner—Richard A. Booth
Attorney, Agent, or Firm—Pennie & Edmonds

[57]   ABSTRACT

A method of manufacturing a semiconductor memory device using a TFT(Thin Film Transistor) is disclosed. This invention not only increase the process margin between a bit line contact and a capacitor contact but also decreases current leakage between memory cells.

27 Claims, 5 Drawing Sheets

METHOD OF MANUFACTURING A SOI DRAM

FIELD OF THE INVENTION

The invention relates to a method of manufacturing a semiconductor memory device using a TFT(Thin Film Transistor), and more particularly, to a semiconductor memory device which not only increases the process margin between a bit line contact and a capacitor contact but also decreases the leakage current between memory cells.

BACKGROUND

Generally, as the integration of Dynamic Random Access Memory(DRAM) has increased, the distance between bit line contacts and word lines as well as the distance between capacitor contacts and bit lines or word lines here decreased rapidly, thereby causing a short phenomena between such contacts and lines.

Hence, process margins decrease since contact formation requires fine control of the alignment tolerance. Leakage current is generated between a diffusion region under a charge storage electrode and a semiconductor substrate as well as between diffusion regions under charge storage electrodes. As the integration of DRAMS has increased, such leakage current has also increased.

Therefore, an object of the present invention is to provide a method of manufacturing a semiconductor memory device capable of increasing the process margin between bit line contacts and the capacitor contacts, thereby decreasing the amount of current leakage between memory cells.

SUMMARY OF THE INVENTION

A method of manufacturing a semiconductor memory device according to the first embodiment of the present invention for achieving the above object and other advantages is comprised of the following process:

A first insulating layer and a first conducting layer are sequentially deposited on a semiconductor substrate and a bit line is then formed by etching an exposed portion of the first conducting layer using a patterning process;

A second insulating layer is then deposited on the resulting structure and a contact hole is formed for connecting the bit line by etching an exposed portion of the second insulating layer using a patterning process;

Polysilicon is then deposited on the resulting structure.

An active region is formed thereon by etching an exposed portion of the polysilicon using a patterning process;

A gate insulating layer is then formed by depositing a gate oxide on the active region;

A second conducting layer and a third insulating layer are then sequentially deposited on the gate insulating layer and a gate electrode is then formed by etching an exposed portion of the second conducting layer and the third insulating layer using a patterning process;

A source region and a drain region are then formed by implanting an impurity in the active region;

A spacer insulating layer is then formed on the side wall of the gate electrode by depositing a fourth insulating layer on the resulting structure and the fourth insulating layer is then anisotropically etched, and a fifth insulating layer is then deposited on the resulting structure;

A charge storage contact is then formed by etching an exposed portion of the fifth insulating layer and the gate insulating layer; using a contact mask; and A charge storage contact is then formed by depositing a third conducting layer on the resulting structure and an exposed portion of the third conducting layer is then etched using a patterning process, and a capacitor insulating layer and a plate electrode are then sequentially formed on the charge storage electrode.

A method of manufacturing a semiconductor memory device according to the second embodiment of the present invention for achieving the above object and other advantages is comprised of the following process:

A bit line is formed on an exposed portion of a semiconductor substrate by the ion implanting method, with the bit line having the type opposite to that of the semiconductor substrate;

A first insulating layer is then deposited on the semiconductor substrate and a contact is then formed by etching an exposed portion of the first insulating layer using mask and etching processes;

Polysilicon is then deposited on the resulting structure and an active region is formed by etching an exposed portion of the polysilicon using the mask and etching processes and a gate insulating layer is then formed on the active region;

A second conducting layer and a third insulating layer are then sequentially formed on the gate insulating layer and a gate electrode is formed by etching an exposed portion of the third insulating layer and the second conducting layer;

A source region a drain region are formed by implanting an impurity in the active region;

A spacer insulating layer is formed on the side wall of the gate electrode by depositing a fourth insulating layer on the resulting structure and the fourth insulating layer is then anisotropically etched, and a fifth insulating layer is deposited on the resulting structure;

A charge storage contact is then formed by etching an exposed portion of the fifth insulating layer using a contact mask; and A charge storage electrode is formed by depositing a third conducting layer on the resulting structure and by etching an exposed portion of the conducting layer using the patterning process, and a capacitor insulating layer and a plate electrode are then sequentially formed on the charge storage electrode.

BRIEF DESCRIPTION OF THE DRAWINGS

For a fuller understanding of the nature and object of the invention, reference should be made to the following detailed description taken in conjunction with the accompanying drawings in which.

Similar reference characters refer to similar parts through out the several views of the drawings.

DETAILED DESCRIPTION OF THE INVENTION

Figure 1:
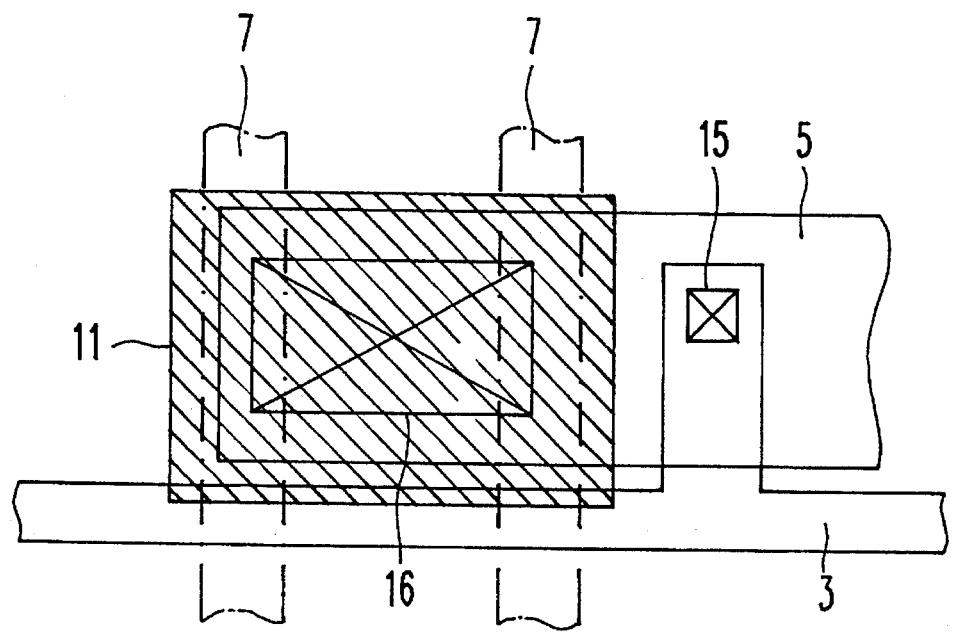
FIG. 1 illustrates a lay-out for manufacturing a semiconductor memory device according to the first embodiment of the present invention.

FIG. 1 illustrates a lay-out for manufacturing a semiconductor memory device according to the first embodiment of the present invention.

A word line 7, a bit line 3 and a charge storage electrode 11 are illustrated in FIG. 1. A bit line contact region 15 shows a portion which is connected to a drain region. A charge storage electrode region 16 shows a portion through which a charge storage electrode 11 and a source region is connected each other. An active region 5 shows a portion which is operated with a thin film transistor.

FIGS. 2A through 2D illustrate cross sectional views showing the process of manufacturing a semiconductor memory device according to the first embodiment of the present invention.

Figure 2A:
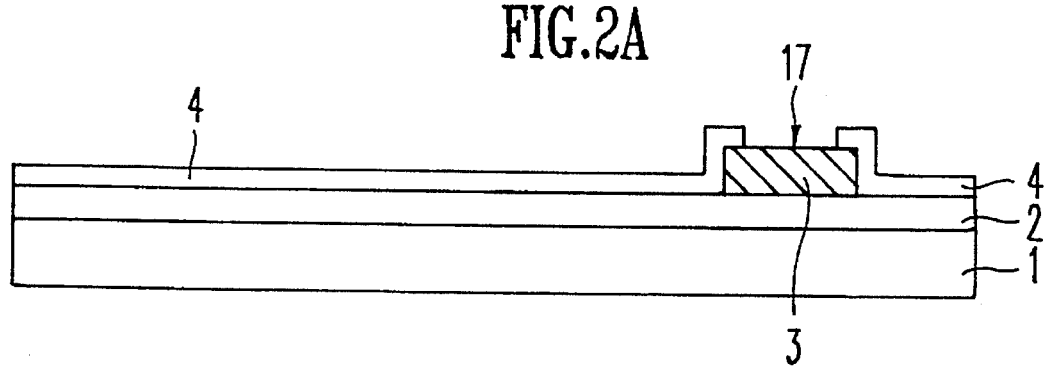
FIGS. 2A through 2D illustrate cross sectional views showing the process of manufacturing a semiconductor memory device according to the first embodiment of the present invention.

Referring to FIG. 2A, a first insulating layer 2 and a first conducting layer 3 are sequentially formed on a semiconductor substrate 1. A bit line 3 is formed by etching an exposed portion of the first conducting layer 3 using a patterning process. A second insulating layer 4 is deposited on the resulting structure and then a contact hole 17 is formed for connecting the bit line by etching an exposed portion of the second insulating layer 4 using a patterning process. A photo mask used in the patterning process for etching the second insulating layer 4 should be larger than the width of the bit line 3.

Figure 2B:
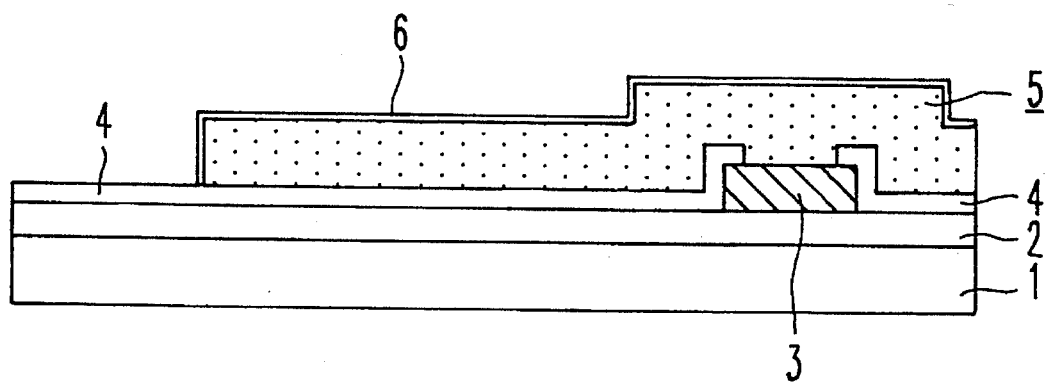

Referring to FIG. 2B, polysilicon is deposited on the resulting structure and then an active region 5 is formed by etching an exposed portion of the polysilicon by means of a patterning process. In order to control the threshold voltage, an impurity ion is implanted on the active region 5. A gate insulating layer 6 is formed on the active region 5 using either the thermal oxidation process or the chemical vapor deposition process.

Alternatively, the polysilicon of the active region 5 may be singly crystallized by the annealing process or increasing in the grain size thereof.

Figure 2C:
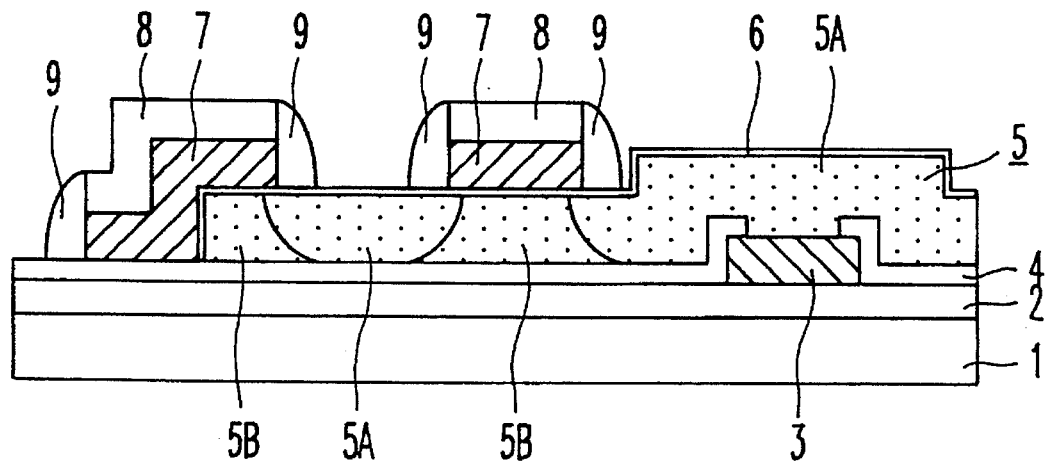

Referring to FIG. 2C, a second conducting layer 7 and a third insulating layer 8 are sequentially formed on the gate insulating layer 6. A gate electrode 7 of a thin film transistor is formed by etching an exposed portion of the third insulating layer 8 and the second conducting layer 7 using a patterning process. A source region and a drain region 5A of the thin film transistor are formed on the active region 5 by implanting an impurity such as a $BF_2$, As, B or P with the gate electrode 7 using a self alignment mask. A spacer insulating layer 9 is formed on the side wall of the gate electrode 7 by depositing a fourth insulating layer on the resulting structure and then anisotropically etching the fourth insulating layer. The reference character 5B shows a channel region of the thin film transistor and the gate electrode 7 is used as a word line of the memory device as shown in FIG. 1.

Figure 2D:
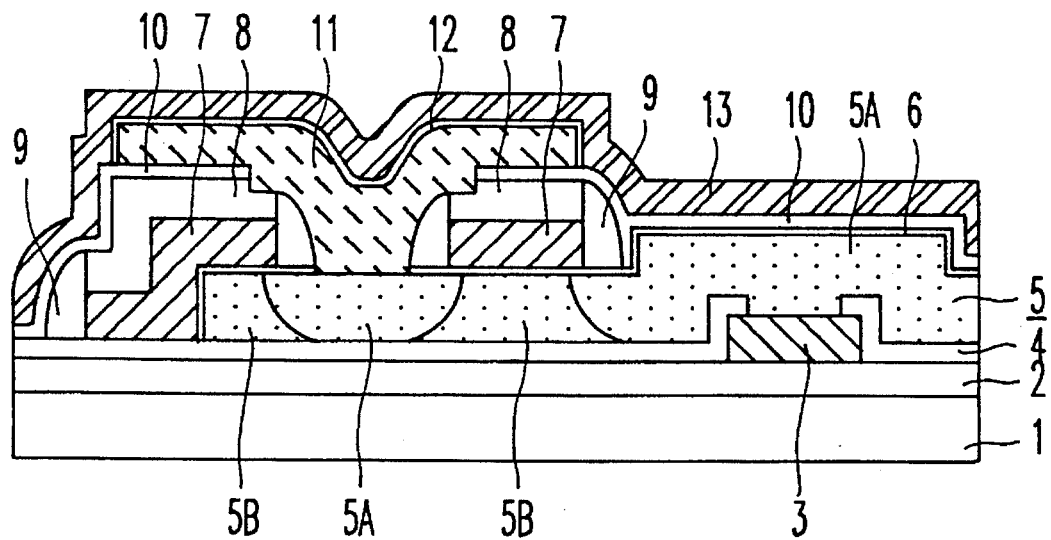

Referring to FIG. 2D, a fifth insulating layer 10 is formed on the resulting structure and then a charge storage contact is formed by etching an exposed portion of the fifth insulating layer 10 using a contact mask. A charge storage electrode 11 is formed by depositing a third conducting layer on the resulting structure and then etching an exposed portion of the third conducting layer using a patterning process. A capacitor insulating layer and a plate electrode are sequentially formed on the charge storage electrode. The capacitor insulating layer is formed with a thin film having a high dielectric constant such as a silicon oxide, a silicon nitride, a tantalum oxide or a PZT.

Figure 3:
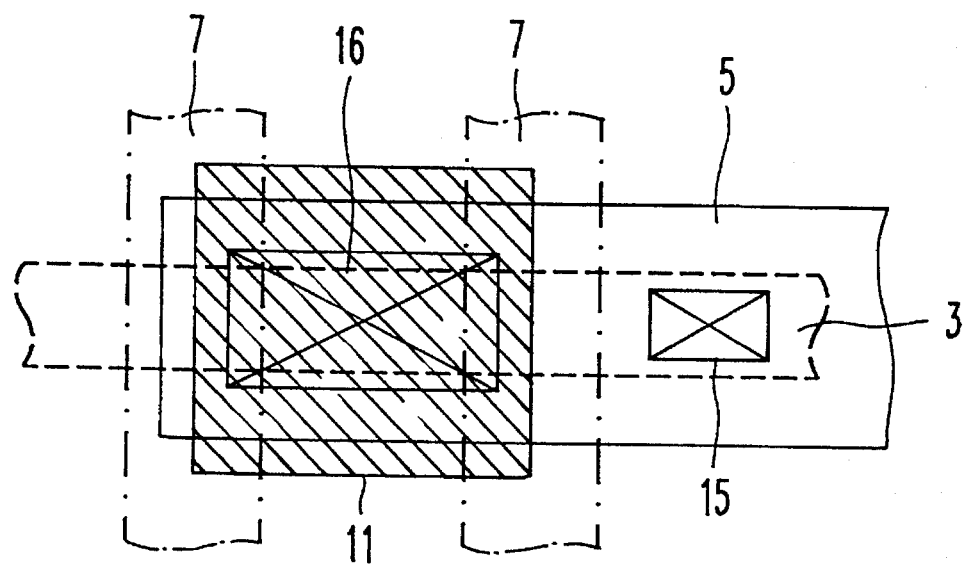
FIG. 3 illustrates a lay-out for manufacturing a semiconductor memory device according to the second embodiment of the present invention.

FIG. 3 illustrates a lay-out for manufacturing a semiconductor memory device according to the second embodiment of the present invention.

A word line 7, a bit line 3 and a charge storage electrode 11 are illustrated in FIG. 3. A bit line contact region 15 shows a portion which is connected to a drain region. A charge storage electrode region 16 shows a portion through which a charge storage electrode 11 and a source region 5A are inter connected. An active region 5 shows a portion which is operated with a thin film transistor.

FIGS. 4A through 4D illustrate cross sectional views showing the process of manufacturing a semiconductor memory device according to the second embodiment of the present invention.

Figure 4A:
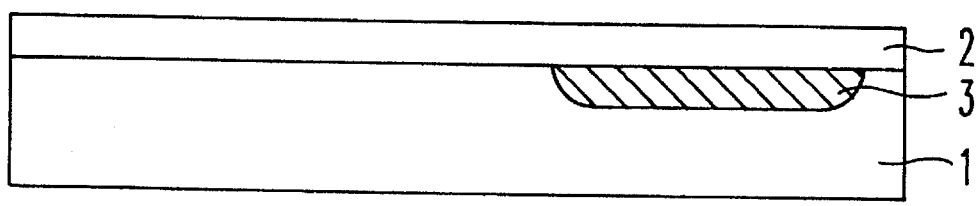
FIGS. 4A through 4D illustrate cross sectional views showing the process of manufacturing a semiconductor memory device according to the second embodiment of the present invention.

Referring to FIG. 4A, a bit line 3 is formed on a portion of a semiconductor substrate 1 by the ion implanting method, the bit line 3 having the type opposite to that of the semiconductor substrate 1. A first insulating layer 2 is deposited on the semiconductor substrate 1.

Figure 4B:
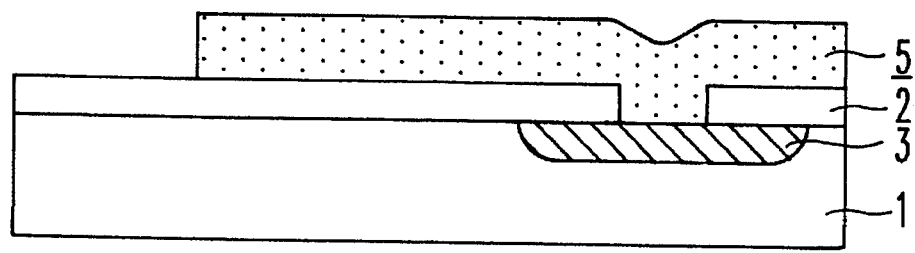

Referring to FIG. 4B, a contact is formed by etching an exposed portion of the first insulating layer 2 using the mask and etching processes. Polysilicon is deposited on the resulting structure and then an active region 5 is formed by etching an exposed portion of the polysilicon using a patterning process. In order to control the threshold voltage, an ion is implanted on the active region 5.

Figure 4C:
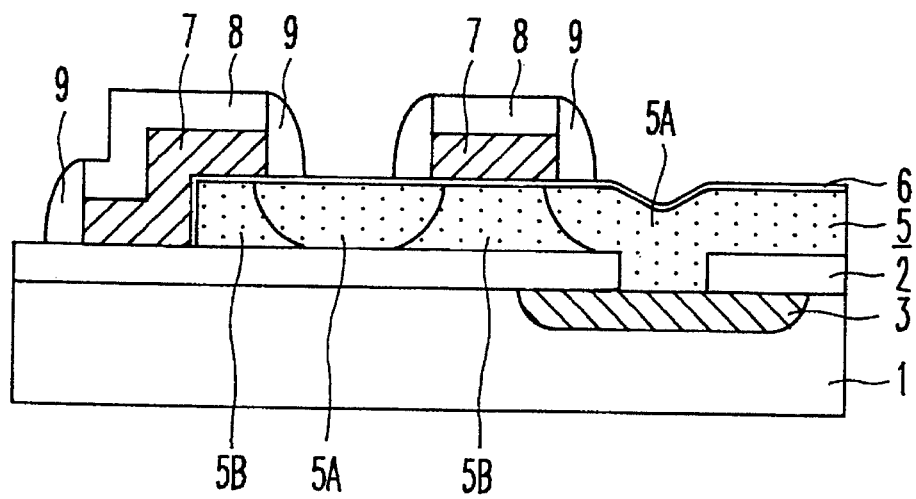

Referring to FIG. 4C, a gate insulating layer 6 is formed on the active region by either the thermal oxidation process or the chemical vapor deposition process. A second conducting layer 7 and third insulating layer 8 are sequentially formed on the gate insulating layer 6. A gate electrode 7 of a thin film transistor is formed by etching an exposed portion of the third insulating layer 8 and the second conducting layer 7 using a patterning process. A source region and a drain region 5A of the thin film transistor are formed on the active region 5 by the ion implanting process. A spacer insulating layer 9 is formed on the side wall of the gate electrode 7 by depositing a fourth insulating layer on the resulting structure and then anisotropically etching the fourth insulating layer. The reference character 5B shows a channel region of the thin film transistor and the gate electrode 7 is used as a word line of the memory device as shown in FIG. 3.

Figure 4D:
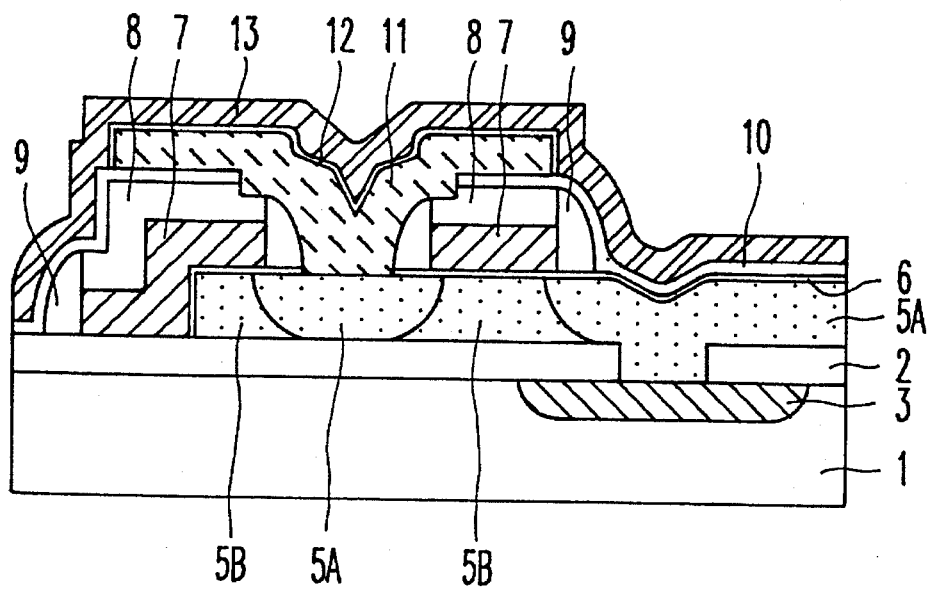

Referring to FIG. 4D, a fifth insulating layer 10 is formed on the resulting structure and then a charge storage contact is formed by etching an exposed portion of the fifth insulating layer 10 using a contact mask. A charge storage electrode 11 is formed by depositing a third conducting layer on the resulting structure and then etching a desired portion of the third conducting layer using the patterning process. A capacitor insulating layer and a plate electrode are then sequentially formed on the charge storage electrode.

Figure 5:
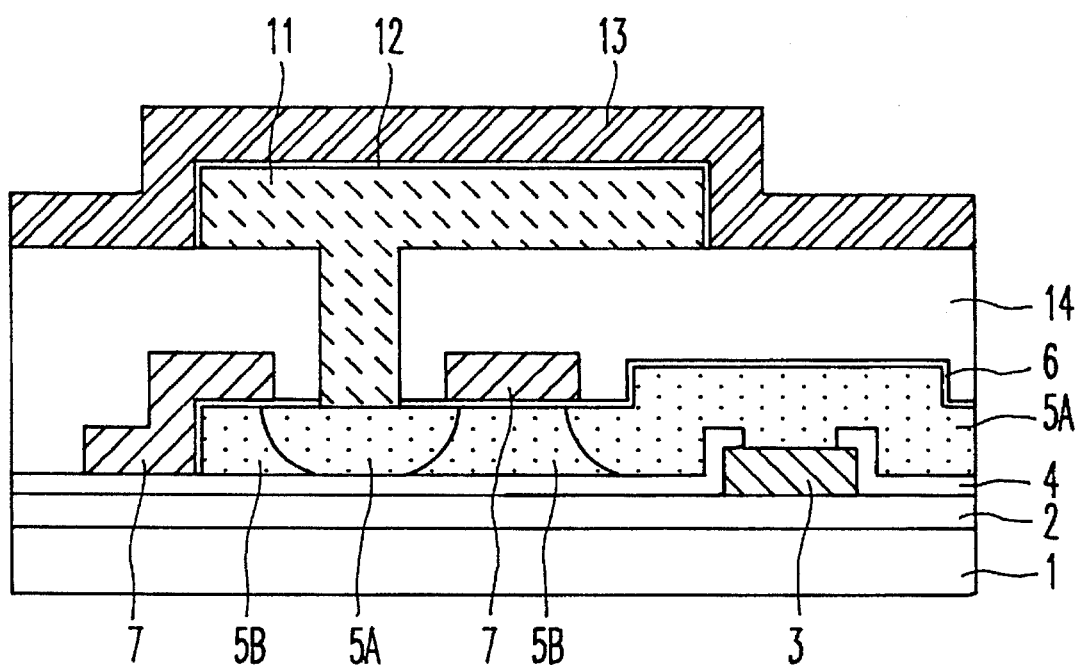
FIG. 5 illustrates a cross sectional view explaining a semiconductor memory device according to the third embodiment of the present invention.

Referring to FIG. 5, the gate electrode 7 is then formed by patterning process and a sixth insulating layer 14 is formed on the resulting structure without formation of the third insulating layer 8 on the second conducting layer 7. The charge storage contact is then formed by patterning an exposed portion of the sixth insulating layer 14.

As described above, a method of manufacturing a semiconductor memory device according to the present invention not only increase the process margin between a bit line contact and a capacitor contact but also decreases the current leakage between memory cells.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of manufacturing a semiconductor memory device, comprising the sequential steps of:

sequentially depositing a first insulating layer and a first conducting layer on a semiconductor substrate and forming a bit line by etching an exposed portion of said first conducting layer using a patterning process;

depositing a second insulating layer on the first insulating layer and the bit line and forming a contact hole for connecting said bit line by etching an exposed portion of said second insulating layer using a patterning process;

depositing polysilicon on the second insulating layer and the bit line contact hole and forming an active region by etching an exposed portion of said polysilicon using a patterning process;

forming a gate insulating layer on said active region;

sequentially depositing a second conducting layer and a third insulating layer on said gate insulating layer and forming a gate electrode by etching an exposed portion of said second conducting layer and said third insulating layer using a patterning process;

forming a source region and a drain region by implanting an impurity in said active region;

forming a spacer insulating layer on a sidewall of said gate electrode by depositing a fourth insulating layer on the resulting structure and then anisotropically etching said fourth insulating layer, and depositing a fifth insulating layer on the resulting structure;

forming a charge storage contact by etching an exposed portion of said fifth insulating layer and said gate insulating layer using a contact mask; and forming a charge storage electrode by depositing a third conducting layer on the resulting structure and etching an exposed portion of said third conducting layer using a patterning process, and then sequentially forming a capacitor insulating layer and a plate electrode on said charge storage electrode.

2. The method of claim 1, wherein said capacitor insulating layer is formed from one of the group consisting of silicon oxide, silicon nitride, tantalum oxide, and PZT.

3. The method of claim 1, wherein said gate insulating layer is formed by a thermal oxidation process.

4. A method of manufacturing a semiconductor memory device, comprising the sequential steps of:

forming a bit line on a portion of a semiconductor substrate by an ion implanting method, with said bit line having the type opposite to that of said semiconductor substrate;

depositing a first insulating layer on said semiconductor substrate and forming a contact hole for connecting said bit line by etching an exposed portion of said first insulating layer using a mask and etching process;

depositing polysilicon on the first insulating layer and the bit line contact hole and forming an active region by etching an exposed portion of said polysilicon using a mask and etching process and then forming a gate insulating layer on said active region;

sequentially forming a first conducting layer and a second insulating layer on said gate insulating layer and forming a gate electrode by etching an exposed portion of said second insulating layer and said first conducting layer using a patterning process;

forming a source region and a drain region by implanting an impurity into said active region;

forming a spacer insulating layer on the sidewall of said gate electrode by depositing a third insulating layer on the resulting structure and anisotropically etching said third insulating layer, and depositing a fourth insulating layer on the resulting structure;

forming a charge storage contact by etching an exposed portion of said fourth insulating layer and gate insulating layer using a contact mask; and forming a charge storage electrode by depositing a second conducting layer on the resulting structure and etching an exposed portion of said second conducting layer by means of a patterning process, and sequentially forming a capacitor insulating layer and a plate electrode on said charge storage electrode.

5. The method of claim 4, wherein said gate insulating layer is formed by a thermal oxidation process.

6. The method of claim 1, wherein said gate insulating layer is formed by a chemical vapor deposition process.

7. A method of manufacturing a semiconductor memory device, comprising the sequential steps of:

sequentially depositing a first insulating layer and a first conducting layer on a semiconductor substrate and forming a bit line by etching an exposed portion of said first conducting layer using a patterning process;

depositing a second insulating layer on the first insulating layer and the bit line and forming a contact hole for connecting said bit line by etching an exposed portion of said second insulating layer using a patterning process;

depositing polysilicon on the second insulating layer and the bit line contact hole and forming an active region by etching an exposed portion of said polysilicon using a patterning process;

annealing said active region to singly crystallize said polysilicon;

forming a gate insulating layer on said active region;

sequentially depositing a second conducting layer and a third insulating layer on said gate insulating layer and forming a gate electrode by etching an exposed portion of said second conducting layer and said third insulating layer using a patterning process;

forming a source region and a drain region by implanting an impurity into said active region;

forming a spacer insulating layer on the side wall of said gate electrode by depositing a fourth insulating layer on the resulting structure and then anisotropically etching said fourth insulating layer, and depositing a fifth insulating layer on the resulting structure;

forming a charge storage contact by etching an exposed portion of said fifth insulating layer and said gate insulating layer using a contact mask; and forming a charge storage electrode by depositing a third conducting layer on the resulting structure and etching an exposed portion of said third conducting layer using a patterning process, and then sequentially forming a capacitor insulating layer and a plate electrode on said charge storage electrode.

8. The method of claim 7, wherein said capacitor insulating layer is formed from one of the group consisting of silicon oxide, silicon nitride, tantalum oxide, and PZT.

9. The method of claim 7, wherein said gate insulating layer is formed by a thermal oxidation process.

10. The method of claim 7, wherein said gate insulating layer is formed by a chemical vapor deposition process.

11. A method of manufacturing a semiconductor memory device, comprising the sequential steps of:

sequentially depositing a first insulating layer and a first conducting layer on a semiconductor substrate and forming a bit line by etching an exposed portion of said first conducting layer using a patterning process;

depositing a second insulating layer on the first insulating layer and the bit line and forming a contact hole for connecting said bit line by etching an exposed portion of said second insulating layer using a patterning process;

depositing polysilicon on the second insulating layer and the bit line contact hole and forming an active region by etching an exposed portion of said polysilicon using a patterning process;

forming a gate insulating layer on said active region;

depositing a second conducting layer on said gate insulating layer and forming a gate electrode by etching an exposed portion of said second conducting layer using a patterning process;

forming a source region and a drain region by implanting an impurity into said active region;

depositing a third insulating layer on the resulting structure;

forming a charge storage contact by etching an exposed portion of said third insulating layer and said gate insulating layer using a contact mask; and forming a charge storage electrode by depositing a third conducting layer on the resulting structure and etching an exposed portion of said third conducting layer using a patterning process, and then sequentially forming a capacitor insulating layer and a plate electrode on said charge storage electrode.

12. The method of claim 11, wherein said capacitor insulating layer is formed from one of the group consisting of silicon oxide, silicon nitride, tantalum oxide, and PZT.

13. The method of claim 11, wherein said gate insulating layer is formed by a thermal oxidation process.

14. The method of claim 11, wherein said gate insulating layer formed by a chemical vapor deposition process.

15. A method of manufacturing a semiconductor memory device, comprising the sequential steps of:

sequentially depositing a first insulating layer and a first conducting layer on a semiconductor substrate and forming a bit line by etching an exposed portion of said first conducting layer using a patterning process;

depositing a second insulating layer on the first insulating layer and the bit line and forming a contact hole for connecting said bit line by etching an exposed portion of said second insulating layer using a patterning process;

depositing polysilicon on the second insulating layer and the bit line contact hole and forming an active region by etching an exposed portion of said polysilicon using a patterning process;

annealing said active region to singly crystallize said polysilicon;

forming a gate insulating layer on said active region;

depositing a second conducting layer on said gate insulating layer and forming a gate electrode by etching an exposed portion of said second conducting layer using a patterning process;

forming a source region and a drain region by implanting an impurity into said active region;

depositing a third insulating layer on the resulting structure;

forming a charge storage contact by etching an exposed portion of said third insulating layer and said gate insulating layer using a contact mask; and forming a charge storage electrode by depositing a third conducting layer on the resulting structure and etching an exposed portion of said third conducting layer using a patterning process, and then sequentially forming a capacitor insulating layer and a plate electrode on said charge storage electrode.

16. The method of claim 15, wherein said capacitor insulating layer is formed with one of the group consisting of silicon oxide, silicon nitride, tantalum oxide, and PZT.

17. The method of claim 15, wherein said gate insulating layer is formed by a thermal oxidation process.

18. The method of claim 15, wherein said gate insulating layer is formed by a chemical vapor deposition process.

19. A method of manufacturing a semiconductor memory device, comprising the sequential steps of;

forming a bit line on a portion of a doped semiconductor substrate by an ion implantation method, with said bit line having a conductivity type opposite to that of said semiconductor substrate;

depositing a first insulating layer on said semiconductor substrate and forming a contact hole for connecting said bit line by etching an exposed portion of said first insulating layer using a mask and etching process;

depositing polysilicon on the first insulating layer and the bit line contact hole and forming an active region by etching an exposed portion of said polysilicon using a mask and etching process and then forming a gate insulating layer on said active region;

forming a first conducting layer on said gate insulating layer and forming a gate electrode by etching an exposed portion of said first conducting layer using a patterning process;

forming a source region and a drain region by implanting an impurity into said active region;

depositing a second insulating layer on the resulting structure;

forming a charge storage contact by etching an exposed portion of said second insulating layer and said gate insulating layer using a contact mask; and forming a charge storage electrode by depositing a second conducting layer on the resulting structure and etching an exposed portion of said second conducting layer by means of a patterning process and sequentially forming a capacitor insulating layer and a plate electrode on said charge storage electrode.

20. The method of claim 19, wherein said gate insulating layer is formed by a thermal oxidation process.

21. The method of claim 19, wherein said gate insulating layer is formed by a chemical vapor deposition process.

22. A method of manufacturing a semiconductor memory device, comprising the sequential steps of:

forming a bit line on a portion of a doped semiconductor substrate by an ion implantation method, with said bit line having a conductivity type opposite to that of said semiconductor substrate;

depositing a first insulating layer on said semiconductor substrate and forming a contact hole for connecting said bit line by etching an exposed portion of said first insulating layer using a mask and etching process;

depositing polysilicon on the first insulating layer and the bit line contact hole and forming an active region by etching an exposed portion of said polysilicon using a mask and etching process;

annealing said active region to singly crystallize said polysilicon;

forming a gate insulating layer on said active region;

forming a first conducting layer on said gate insulating layer and forming a gate electrode by etching an exposed portion of said first conducting layer using a patterning process;

forming a source region and a drain region by implanting an impurity into said active region;

depositing a second insulating layer on the resulting structure;

forming a charge storage contact by etching an exposed portion of said second insulating layer and said gate insulating layer using a contact mask; and forming a charge storage electrode by depositing a second conducting layer on the resulting structure and etching an exposed portion of said second conducting layer by means of a patterning process, and sequentially forming a capacitor insulating layer and a plate electrode on said charge storage electrode.

23. The method of claim 22, wherein said gate insulating layer is formed by a thermal oxidation process.

24. The method of claim 22, wherein said gate insulating layer is formed by a chemical vapor deposition process.

25. A method of manufacturing a semiconductor memory device, comprising the sequential steps of:

forming a bit line on a portion of a doped semiconductor substrate by an ion implantation method, with said bit line having the a conductivity type opposite to that of said semiconductor substrate;

depositing a first insulating layer on said semiconductor substrate and forming a contact hole for connecting said bit line by etching an exposed portion of said first insulating layer using a mask and etching process;

depositing polysilicon on the first insulating layer and the bit line contact hole and forming an active region by etching an exposed portion of said polysilicon using a mask and etching process and then forming a gate insulating layer on said active region;

annealing said active region to singly crystalize said polysilicon;

sequentially forming a first conducting layer and a second insulating layer on said gate insulating layer and forming a gate electrode by etching an exposed portion of said second insulating layer and said first conducting layer using a patterning process;

forming a source region and a drain region by implanting an impurity into said active region;

forming a spacer insulating layer on the sidewall of said gate electrode by depositing a third insulating layer on the resulting structure and anisotropically etching said third insulating layer, and depositing a fourth insulating layer on the resulting structure;

forming a charge storage contact by etching an exposed portion of said fourth insulating layer and gate insulating layer using a contact mask; and forming a charge storage electrode by depositing a second conducting layer on the resulting structure and etching an exposed portion of said second conducting layer by means of a patterning process, and sequentially forming a capacitor insulating layer and a plate electrode on said charge storage electrode.

26. The method of claim 25, wherein said gate insulating layer is formed by a thermal oxidation process.

27. The method claim 25, wherein said gate insulating layer is formed by a chemical vapor deposition process.

* * * * *